United States Patent
Zeng et al.

(10) Patent No.: US 10,854,536 B2
(45) Date of Patent: Dec. 1, 2020

(54) FINGERPRINT CHIP PACKAGE AND METHOD FOR PROCESSING SAME

(71) Applicant: SHENZHEN GOODIX TECHNOLOGY CO., LTD., Shenzhen (CN)

(72) Inventors: Shanshan Zeng, Shenzhen (CN); Penghui Wang, Shenzhen (CN); Junping Luo, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/133,668

(22) Filed: Sep. 17, 2018

(65) Prior Publication Data

US 2019/0019744 A1    Jan. 17, 2019

Related U.S. Application Data

(63) Continuation of application No. PCT/CN2017/072043, filed on Jan. 22, 2017.

(51) Int. Cl.
*H01L 23/495* (2006.01)
*H01L 23/31* (2006.01)
*H01L 23/00* (2006.01)
*G06K 9/00* (2006.01)
(Continued)

(52) U.S. Cl.
CPC ...... *H01L 23/4951* (2013.01); *G06K 9/00006* (2013.01); *H01L 21/4832* (2013.01);
(Continued)

(58) Field of Classification Search
None
See application file for complete search history.

(56) References Cited

U.S. PATENT DOCUMENTS 6,797,540 B1    9/2004    Li et al.
2003/0207498 A1*  11/2003    Islam ............... H01L 23/3114
                                                438/120

(Continued)

FOREIGN PATENT DOCUMENTS

| JP | 2001-060261 A | 3/2001 |
| JP | 2011-066241 A | 3/2011 |
| TW | 429570 B | 4/2001 |

OTHER PUBLICATIONS

The Chinese First Examination Report, including the Search Report of corresponding Chinese application No. 201780000027.2, dated Oct. 22, 2018.

(Continued)

*Primary Examiner* — Alexander G Ghyka
(74) *Attorney, Agent, or Firm* — J.C. Patents

(57) ABSTRACT

A fingerprint chip package and method for processing same, relating to a field of biometric identification. The fingerprint chip package includes: a lead frame (1), a chip (2), and a plastic packaging part enclosing the lead frame (1) and the chip (2); the lead frame (1) comprises a base island (13), a connecting rib (11), and a golden finger (12); the base island (13) is used for bearing the chip (2); the connecting rib (11) is used for supporting the lead frame (1) and connecting the base island (13) via the golden finger (12); and the golden finger (12) is used for fixing the base island (13) and electrically connecting with the chip (2).

5 Claims, 3 Drawing Sheets

(51) Int. Cl.
*H01L 21/56* (2006.01)
*H01L 21/66* (2006.01)
*H01L 21/48* (2006.01)

(52) U.S. Cl.
CPC ............ *H01L 21/56* (2013.01); *H01L 21/565* (2013.01); *H01L 22/14* (2013.01); *H01L 22/32* (2013.01); *H01L 23/3121* (2013.01); *H01L 23/49541* (2013.01); *H01L 24/05* (2013.01); *H01L 24/48* (2013.01); *H01L 24/83* (2013.01); *H01L 24/85* (2013.01); *H01L 24/92* (2013.01); *H01L 23/3107* (2013.01); *H01L 23/49582* (2013.01); *H01L 2224/04042* (2013.01); *H01L 2224/05624* (2013.01); *H01L 2224/48247* (2013.01); *H01L 2224/85444* (2013.01); *H01L 2224/92247* (2013.01); *H01L 2924/00014* (2013.01)

(56) References Cited

U.S. PATENT DOCUMENTS

| | | |
|---|---|---|
| 2004/0055155 A1 | 3/2004 | Manansala |
| 2005/0001292 A1* | 1/2005 | Hatauchi ............. H01L 23/3107 257/666 |
| 2010/0319987 A1 | 12/2010 | Golick et al. |
| 2015/0076675 A1 | 3/2015 | Real et al. |
| 2016/0148876 A1 | 5/2016 | Kitnarong et al. |
| 2016/0358007 A1* | 12/2016 | Chung .................. H01L 24/48 |

OTHER PUBLICATIONS

The extended European Search Report of corresponding European application No. 17 89 2751, dated Oct. 16, 2019.

* cited by examiner

FINGERPRINT CHIP PACKAGE AND METHOD FOR PROCESSING SAME

CROSS-REFERENCE TO RELATED APPLICATIONS

This present application is a continuation of International Application No. PCT/CN2017/072043, filed on Jan. 22, 2017, which is incorporated herein by reference in their entirety.

TECHNICAL FIELD

The present disclosure relates to the field of biometric identification, in particular, to a fingerprint chip package and method for processing same.

BACKGROUND

A fingerprint chip package needs to be cut into different shapes according to different requirements of customers. Therefore, it is generally shipped in strips, it will be tested first before being shipped, which is also called test in strips.

FIG. 1 is an internal structural diagram of a package body with existing common lead frame type, a connecting rib connects with all the components of the lead frame, including a base island for placing chips and golden fingers for connecting the package with an external PCB (printed circuit board), to achieve a physical connection; in the process of packaging, an electrical connection is achieved by a connection between the internal components of the lead frame and the aluminum pad of the chip through a bonding wire. Different components will be given different electrical signals. Since all the components are connected by the connecting rib, all the components are electrically short-circuited and the test in strips cannot be performed.

Generally, there are four connecting ribs supporting the base island within one unit of the lead frame. For some large-sized package body, the connecting ribs are deformed easily since it is too long, which causes the base island to lean. The fingerprint chip generally has a large area. In the case that the common lead frame design is applied to a fingerprint chip package, an abnormality in a deformation of the lead frame occurs easily, which effects the production stability and the yield.

In addition, the connecting ribs are made of metal and are less likely to be cut than the package with plastic element.

SUMMARY

In order to overcome deficiencies of related products in the prior art, the present disclosure provides a fingerprint chip package and method for processing same, which solves the problem of the instability of the current fingerprint chip packaging structure.

The present disclosure provides a fingerprint chip package, including: a lead frame, a chip, and a plastic packaging part enclosing the lead frame and the chip; where the lead frame includes a base island, a connecting rib, and a golden finger; the base island is used for bearing the chip; the connecting rib is used for supporting the lead frame and connecting the base island via the golden finger; and the golden finger is used for fixing the base island and electrically connecting with the chip.

As a further improvement to the present disclosure, the golden finger is disposed on four sides of the lead frame, respectively, and at least one golden finger is disposed on each side.

As a further improvement to the present disclosure, the golden finger is used for fixing the base island and electrically connecting with the chip, which includes: the golden fingers on at least two sides are connected with the base island so as to fix the base island; and the golden finger on at least one side is electrically connected with the chip.

As a further improvement to the present disclosure, the golden fingers on three sides are connected with the base island, and the golden finger on one side is electrically connected with the chip.

As a further improvement to the present disclosure, at least one aluminum pad is provided on the chip; and the golden finger is electrically connected with the chip, comprising: the aluminum pads on the chip are connected with the golden finger in a one-to-one correspondence using a bonding wire.

As a further improvement to the present disclosure, further comprising: the electrical connection between the golden fingers for electrically connecting the chips is completely disconnected.

The present disclosure provides a method for processing a fingerprint chip package, used for processing the above fingerprint chip package, including: adhering and fixing a chip to a base island of a lead frame; connecting electrically with the chip and the golden finger on at least one side using a bonding wire; injection molding the fingerprint chip package using a plastic packaging part; and disconnecting the electrical connection between the golden fingers electrically connected with the chip.

As a further improvement to the present disclosure, the disconnecting the electrical connection between the golden fingers electrically connected with the chip includes: back-etching connecting rib corresponding to the golden finger electrically connected with the chip so as to disconnect the electrical connection between the golden fingers electrically connected with the chip.

As a further improvement to the present disclosure, further including: testing the fingerprint chip package in strips.

Compared with the prior art, the present disclosure has the following advantages:

The cutting difficulty of the fingerprint chip package is effectively reduced, and the efficiency of separation of single package is improved. And the contact area between the golden fingers on the multiple sides of the connecting rib and the base island is larger than the contact area between the connecting rib and the base island in the prior art, and thus the production stability of the adhesion of chip and connection of bonding wire is improved. And the connecting rib on the end of the golden fingers electrically connected with the chip is etched completely, so that the electrical connections between each internal components of the fingerprint chip package and the adjacent fingerprint chip package are all disconnected. The test in strips to the fingerprint chip package can be achieved.

BRIEF DESCRIPTION OF DRAWINGS

In order to more clearly illustrate the technical solutions in the embodiments of the present disclosure, the drawings used in the embodiments will be briefly described below. Obviously, the drawings in the following description are merely some embodiments of the present disclosure. For those skilled in the art, other drawings can also be obtained based on these drawings without any creative effort.

DESCRIPTION OF EMBODIMENTS

Figure 1:
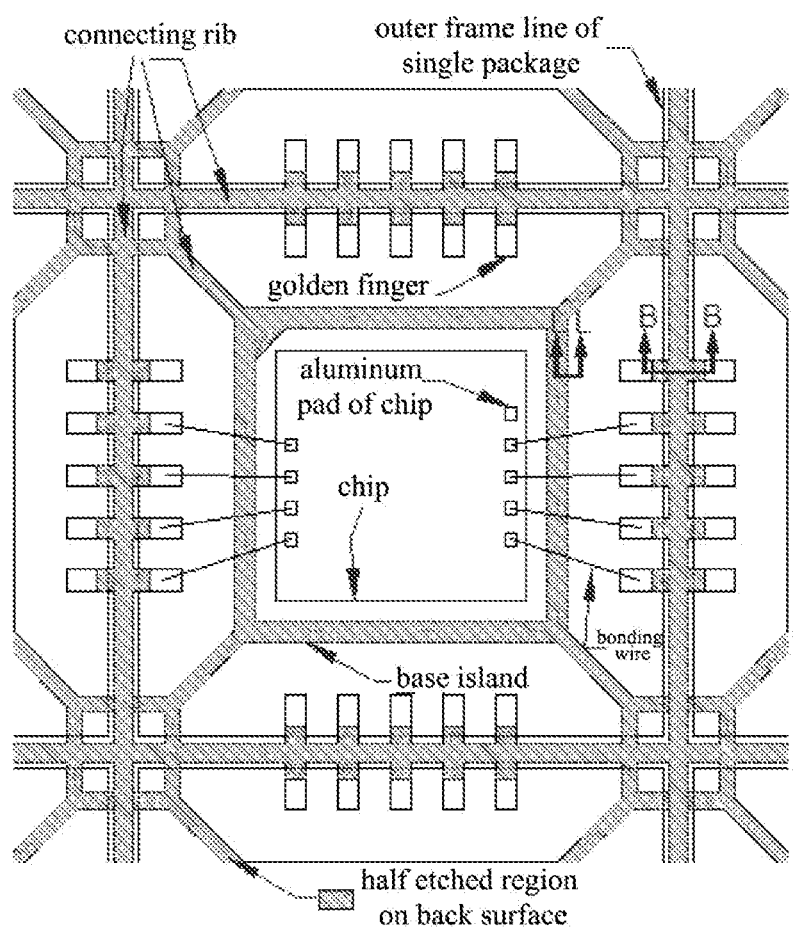
FIG. 1 is an internal schematic structural diagram of a package body with existing common lead frame type.

In order to make the technical solutions of the present disclosure be understood by those skilled in the art more clearly, the technical solutions of the embodiments of the present disclosure will be clearly and completely described below with reference to the drawings in the embodiments of the present disclosure. Obviously, the described embodiments are only a part of the embodiments of the present disclosure, but not all the embodiments. The preferred embodiments of the present disclosure are given in the drawings. The present disclosure can be achieved in many different forms and is not limited to the embodiments described herein. Rather, the embodiments of the present disclosure are provided to make the disclosure of the present disclosure be understood more thorough and comprehensive. Based on the embodiments of the present disclosure, all other embodiments obtained by those ordinary skilled in the art without creative effort are within the scope protected by the present disclosure.

Unless otherwise defined, all the technical and scientific terms used herein have the same meaning as commonly understood by those ordinary skilled in the art to which the present disclosure belongs. The terms used in the description of the present disclosure herein are only for the purpose of describing particular embodiments and is not intended to limit the present disclosure. The terms "first", "second" and the like in the description, the claims and the above drawings of the present disclosure are used for distinguishing different objects, rather than describing a specific sequence. In addition, the terms "comprise" and "have" and any variants thereof are intended to cover non-exclusive inclusions. For example, a process, method, system, product, or device that comprises a series of steps or units is not limited to the listed steps or units, but may also optionally includes steps or units that are not listed, or may also optionally includes other steps or units that inherent to the process, method, product, or device.

The "an embodiment" referred herein means that a particular feature, structure, or characteristic described in combination with an embodiment can be included in at least one embodiment of the present disclosure. The phrases appeared in various places of the description do not necessarily all refer to the same embodiment, nor are they independent or alternative embodiments that are mutually exclusive from other embodiments. It will be understood by those skilled in the art, both explicitly and implicitly, that the embodiments described herein can be combined with other embodiments.

Figure 2:
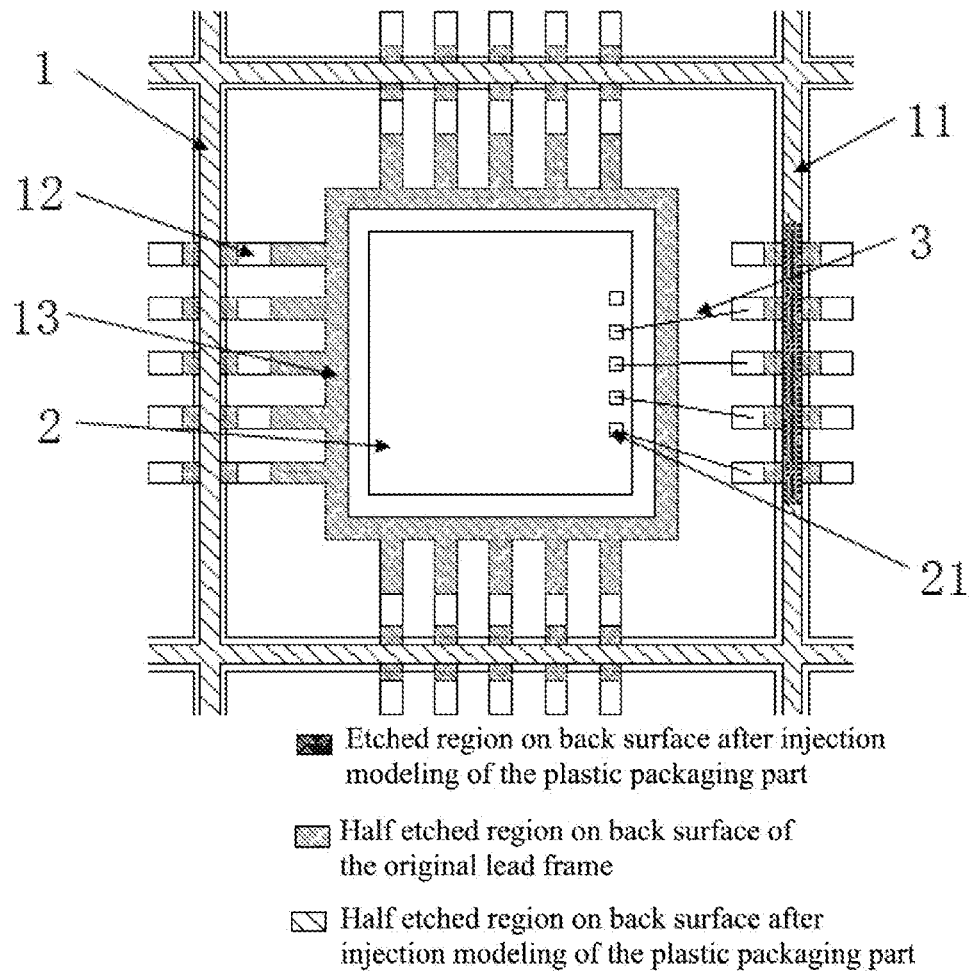
FIG. 2 is schematic structural diagram of the fingerprint chip package according to an embodiment of the present disclosure.

Referring to FIG. 2, the fingerprint chip package includes a lead frame 1, a chip 2, and a plastic packaging part (not shown) enclosing the lead frame 1 and the chip 2. The chip 2 is disposed in the middle region of the lead frame 1 and is fixedly connected with the lead frame 1, and the chip 2 is a silicon-based fingerprint chip. In other implementations, the chip 2 may also be a chip of other materials or other functions.

The lead frame 1 is a carrier of the chip 2 and is mainly used for connecting with an internal circuit of the chip 2 and an external PCB. The chip 2 is adhered and fixed to the lead frame 1, and the lead frame 1 includes a base island 13, a connecting rib 11 and a golden finger 12.

The connecting rib 11 is a frame made of metal material and includes four sides, which are structures that are physically connected with all the components in the lead frame. At least one golden finger 12 is provided on each side of the connecting rib 11. The connecting rib 11 is used for supporting the lead frame 1 and connecting with the base island 13 via the golden finger 12. The golden finger 12 is used for electrically connecting the chip 2 with the external structure of the fingerprint chip package as well as fixing the base island 13. The number of the golden finger 12 on each side of the connecting rib 11 is set according to actual requirements. In the embodiment of the present disclosure, the number of the golden finger 12 on each side of the connecting rib 11 is the same. In other implementations of the present disclosure, the number of the golden finger 12 on each side of the connecting rib 11 may also be different. A base island 13 is provided in the middle region of the lead frame 1. The base island 13 is fixedly connected with the golden finger 12 on at least two sides. The chip 2 is fixedly provided on the base island 13. At least one aluminum pad 21 is provided on the chip 2, the aluminum pad 21 is electrically connected with the golden finger 12 on at least one side via a bonding wire 3. Where the aluminum pad 21 on the chip 2 is connected with the golden finger 12 in a one-to-one correspondence using the bonding wire 3, and the golden finger 12 on the remaining side is fixedly connected with the base island 13. The chip 2 transmits the electric signal to the structure of external PCB via the electrical connection with the golden finger 12. In other embodiments of the present disclosure, the number and arrangement of golden fingers connected with the aluminum pad 21 via the bonding wire 3 may be flexibly selected, which may be continuously arranged or dispersedly arranged, and the number is not limited to one row.

Before the injection molding of a plastic packaging part, the connecting rib his not processed in the embodiment of the present disclosure at first. After the injection molding of the plastic packaging part is completed, since the back surface of the connecting rib 11 is located on the same plane with the injection-molded template, the back surface of the connecting rib 11 is not covered by the injection-molded material. After the injection molding of a plastic packaging part is completed, the connecting rib 11 may be etched, so that the electrical connection between the golden fingers 12 and the adjacent single package is disconnected. Specifically:

As shown in FIG. 2, where the light-colored region in the figure is a position where the connecting rib 11 is half-etched and the dark-colored region in the figure is a position where the connecting rib 11 is completely etched. The base island 13 is fixedly connected with the golden finger 12 on any three sides of the connecting rib 11. The aluminum pad 21 is electrically connected with the golden finger 12 on the fourth side of the connecting rib 11 via the bonding wire 3. In other embodiments of the present disclosure, the size and distribution of the region of the connecting rib 11 connected with the base island 13 and the size and distribution of the region of the connecting rib 11 at the end of the golden finger 12 electrically connected with the chip 2 may be flexibly selected. Before the plastic packaging part is injection molded, the connecting rib 11 is not etched. After the injection molding of the plastic packaging part is completed, the three sides of the connecting rib 11 connected with the base island 13 is half-etched, the fourth side of the connecting rib 11 where the golden finger 12 connected with the chip 2 via the bonding wire 3 is located, is completely etched. The completely etched portion is located in a region fixedly connected with the golden finger 12. In other implementations, the range of the completely etching thereof may also be selected according to actual requirements. Through the process, the fourth side of the connecting rib 11 electrically connected with the external via the bonding wire 3 is disconnected from the other sides of the connecting rib 11, so that the electrical connection between each component in the fingerprint chip package is completely disconnected. Due to the presence of the plastic packaging part, even if the connecting rib 11 portion is completely etched, the plastic packaging part is enough to support the physical structure of each component in the fingerprint chip package. On the basis of the structural stability is guaranteed, the test in strips to the fingerprint chip package may be achieved. The positions of the half etching and the complete etching are all located on the back surface of the connecting rib 11.

In other implementations of the present disclosure, the position where the chip 2 and the golden finger 12 is electrically connected may be one side or multiple sides, can be selected according to actual conditions. The arrangement of the golden finger 12 electrically connected with the chip 2 may be flexibly selected, arranged continuously or dispersedly placed. When the positions of the electrical connection of the chip 2 and the golden finger 12 are multiple sides, the connecting rib 11 connected with the golden finger 12 is completely etched accordingly. That is, the completely etched connecting rib 11 is also multiple sides.

The etching refers to means of removing the material by a chemical method. In the embodiment of the present disclosure, the half etching of the connecting rib 11 refers to half of a thickness of the connecting rib 11 is etched, which is used for maintaining the physical structure of each component, in the fingerprint chip package, connected with the connecting rib 11. The complete etching of the connecting rib 11 means that the entire thickness of the connecting rib 11 is etched, that is, the connecting rib 11 is completely removed. The complete etching of the connecting rib 11 is used for disconnecting the whole connecting rib 11 so as to avoid, the electrical short circuit of each component in the fingerprint chip package due to the connection effect of the connecting rib 11. In other implementations of the present disclosure, the depth of the complete etching may also be other thicknesses as long as electrical connection between each component in the fingerprint chip package is disconnected.

In the present disclosure, the connecting rib 11 connected with the base island 13 is half etched on the back surface after the injection molding is completed. In other embodiments, the connecting rib 11 connected with the base island 13 may also be half etched on the back before the injection molding. Since the connecting rib 11 connected with the base island 13 is not electrically connected with the chip 2, the etching means, the etching thickness, and the etching region thereof can be flexibly selected.

In the present disclosure, the connecting rib 11 at the end of the golden finger 12 which are electrically connected with the chip 2 is completely etched on the back surface after the injection molding is completed so as to disconnect the electrical connection. In other embodiments, the connecting rib 11 at the end of the golden finger 12 which are electrically connected with the chip 2 may also be half etched on the front surface before the injection molding, and then be half etched on the back surface after the injection molding. The etching method, etching thickness, and etching region may also be flexibly selected. As long as the means disconnects the electrical connection of each component in the package body through the etching means, it is within the protection scope of the present disclosure.

In the embodiment of the present disclosure, the golden fingers 12 on any three sides of the connecting rib 11 are fixedly connected with the base island 13, rather than fixing the base island 13 at four corners of the lead frame via the connecting rib, which can effectively reduce the difficulty of cutting the fingerprint chip package and improve the efficiency of separation the single package. And the contact area between the golden fingers 12 on the multiple sides of the connecting rib 11 and the base island 13 is greater than the contact area between the connecting rib 11 and the base island 13 in the prior art, and thus the production stability of adhesion of the chip 2 and connection of bonding wire 3 is improved. And the connecting rib 11 on the end of the golden finger 12 electrically connected with the chip 2 is etched completely, so that the electrical connections between each internal component of the fingerprint chip package and the adjacent fingerprint chip package are all disconnected. The test in strips to the fingerprint chip package can be achieved.

Figure 3:
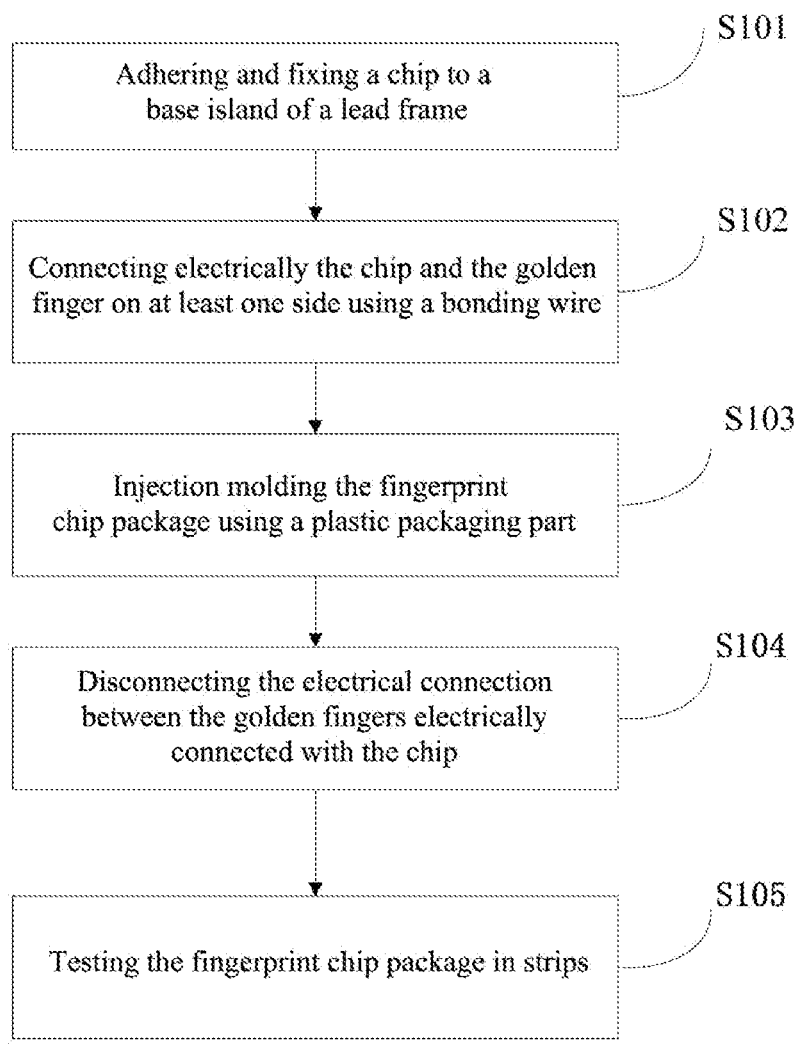
FIG. 3 is a schematic flowchart of a method for processing the fingerprint chip package according to an embodiment of the present disclosure.

Based on the above embodiments, referring to FIG. 3, which is a schematic flowchart of a processing method applied to the fingerprint chip package according to the present disclosure. The processing method of the fingerprint chip package includes:

S101: adhering and fixing a chip to a base island of a lead frame.

S102: connecting electrically the chip and the golden finger on at least one side using a bonding wire.

S103: injection molding the fingerprint chip package using a plastic packaging part.

S104: disconnecting the electrical connection between the golden fingers electrically connected with the chip.

In the embodiment of the present disclosure, the electrical connection between the golden fingers electrically connected with the chip is disconnected by back-etching the connecting rib corresponding to the golden finger electrically connected with the chip.

Optionally, in the embodiment of the present disclosure, the processing method of the fingerprint chip package further includes:

S105: testing the fingerprint chip package in strips.

The method for processing the fingerprint chip package according to the embodiments of the present disclosure is applied to the fingerprint chip package provided by the embodiments aforementioned. The method for processing the fingerprint chip package has the corresponding functional modules and beneficial effects of the above fingerprint chip package. Please refer to the embodiments of the fingerprint chip package aforementioned, to which unnecessary details will not be given here.

In the above embodiments of the present disclosure, it should be understood that the disclosed apparatus and method can be implemented by other means. For example, the device embodiments described above are merely schematic. For example, the division of the modules is only a division of a logical function, and there may be another division manner during the actual implementation. For example, multiple modules or components may be combined or can be integrated into another system, or some features can be ignored or not executed.

The modules illustrated as separate components may or may not be physically separated, and the components displayed as modules may or may not be physical modules, that is, they may be located in one place, or may be distributed on multiple network units. According to actual requirements, some or all of the modules may be selected to achieve the purpose of the solution of the embodiments.

The above are merely embodiments of the present disclosure, but do not limit the scope of the present disclosure. Although the present disclosure has been illustrated in detail with reference to the above embodiments, it is still possible for those skilled in the art to modify the technical solution described in each of the above implementation, or equivalently replacing some of the technical features thereof. Any equivalent structure made by using the description and drawing contents of the present disclosure, or those made directly or indirectly using the technical solutions in other related technical fields are similarly included in the protected scope of the present disclosure.

What is claimed is:

1. A fingerprint chip package, comprising:
    a lead frame, a chip, and a plastic packaging part enclosing the lead frame and the chip; wherein
    the lead frame comprises a base island, a connecting rib, and connecting fingers, wherein the connecting rib is a metal frame;
    the base island is used for bearing the chip;
    the connecting fingers comprises a first connecting finger and a second connecting finger;
    the base island is fixedly connected to the connecting rib via the first connecting finger on at least two sides of the connecting rib; and
    the chip is electrically connected to the second connecting finger on at least one side of the connecting rib, wherein the connecting rib on an end of the second connecting finger is disconnected.

2. The fingerprint chip package according to claim 1, wherein the connecting fingers are disposed on four sides of the connecting rib, respectively, and at least one connecting finger is disposed on each side.

3. The fingerprint chip package according to claim 1, wherein the base island is fixedly connected to the multiple first connecting fingers on three sides, and the chip is electrically connected to the second connecting finger on one side.

4. The fingerprint chip package according to claim 1, wherein at least one aluminum pad is provided on the chip; and
    the aluminum pads on the chip are connected with the second connecting finger using a bonding wire.

5. The fingerprint chip package according to claim 2, wherein at least one aluminum pad is provided on the chip; and
    the aluminum pads on the chip are connected with the second connecting finger using a bonding wire.

* * * * *